United States Patent
Vispute et al.

(10) Patent No.: US 9,719,165 B2
(45) Date of Patent: Aug. 1, 2017

(54) METHOD OF MAKING CERAMIC GLASS

(71) Applicants: Solar-Tectic, LLC, Briarcliff Manor, NY (US); Ratnakar D. Vispute, Columbia, MD (US)

(72) Inventors: Ratnakar D. Vispute, Columbia, MD (US); Ashok Chaudhari, Briarcliff Manor, NY (US)

(73) Assignees: Blue Wave Semiconductors, Inc., Baltimore, MD (US); Solar-Tectic LLC, New York, NY (US)

( * ) Notice: Subject to any disclaimer, the term of this patent is extended or adjusted under 35 U.S.C. 154(b) by 82 days.

(21) Appl. No.: 14/663,067

(22) Filed: Mar. 19, 2015

(65) Prior Publication Data

US 2015/0267289 A1   Sep. 24, 2015

Related U.S. Application Data

(60) Provisional application No. 61/955,543, filed on Mar. 19, 2014.

(51) Int. Cl.
| | |
|---|---|
| *C23C 8/00* | (2006.01) |
| *C23C 14/08* | (2006.01) |
| *C23C 14/18* | (2006.01) |
| *C03C 17/00* | (2006.01) |
| *C23C 14/02* | (2006.01) |
| *C23C 14/06* | (2006.01) |
| *C23C 14/10* | (2006.01) |

(Continued)

(52) U.S. Cl.
CPC ............ *C23C 14/082* (2013.01); *C03C 17/00* (2013.01); *C23C 14/024* (2013.01); *C23C 14/0641* (2013.01); *C23C 14/083* (2013.01); *C23C 14/10* (2013.01); *C23C 14/18* (2013.01); *C23C 14/5853* (2013.01); *C30B 23/00* (2013.01)

(58) Field of Classification Search
CPC ....... C23C 14/08; C23C 14/082; C23C 14/18; C23C 14/024; C23C 14/10; C23C 14/5853
See application file for complete search history.

(56) References Cited

U.S. PATENT DOCUMENTS

| | | | |
|---|---|---|---|
| 3,346,414 A | 10/1967 | Ellis et al. | |
| 3,377,494 A * | 4/1968 | Repsher | C03C 17/25 313/489 |
| 5,635,245 A | 6/1997 | Kimock et al. | |

(Continued)

FOREIGN PATENT DOCUMENTS

| | | | | |
|---|---|---|---|---|
| JP | WO 2013099752 A1 * | 7/2013 | ............. | C23C 16/36 |
| WO | 2013099752 A1 | 7/2013 | | |

OTHER PUBLICATIONS

Saraiva, Marta, Sputter Deposition of MgO Thin Films: The Effect of Cation Substitution, PhD Thesis, Universiteit Gent, Apr. 2012, all pages.*

(Continued)

*Primary Examiner* — Kelly M Gambetta
(74) *Attorney, Agent, or Firm* — Carter Ledyard & Milburn LLP

(57) ABSTRACT

A method is provided for manufacturing ceramic glass, including sapphire glass, for use in display covers in smartphones, computers, and watches, as well as for use as substrates on which semiconductor films can be deposited for a wide range of electronic applications, including solar cells, LEDs, and FETs.

22 Claims, 2 Drawing Sheets

(51) Int. Cl.
*C23C 14/58* (2006.01)
*C30B 23/00* (2006.01)

(56) References Cited

U.S. PATENT DOCUMENTS

| | | | |
|---|---|---|---|
| 5,686,738 | A | 11/1997 | Moustakas |
| 7,320,832 | B2 | 1/2008 | Palumbo et al. |
| 7,662,678 | B2 | 2/2010 | Xianyu et al. |
| 8,715,779 | B2 | 5/2014 | Shedletsky et al. |
| 2006/0115964 | A1* | 6/2006 | Findikoglu ............. C30B 25/18 438/509 |
| 2009/0297774 | A1* | 12/2009 | Chaudhari .......... C03C 17/3618 428/149 |
| 2009/0308239 | A1 | 12/2009 | Jones et al. |
| 2011/0033969 | A1* | 2/2011 | Chaudhari ........ H01L 21/02422 438/73 |
| 2012/0327568 | A1 | 12/2012 | Shedletsky et al. |
| 2014/0090864 | A1 | 4/2014 | Paulson |
| 2014/0093711 | A1 | 4/2014 | Paulson |
| 2014/0116329 | A1 | 5/2014 | Chaudhari |
| 2014/0134397 | A1 | 5/2014 | Amin et al. |
| 2014/0226269 | A1 | 8/2014 | Shedletsky et al. |
| 2014/0319432 | A1 | 10/2014 | Goeke et al. |
| 2014/0362444 | A1 | 12/2014 | Paulson |
| 2015/0064422 | A1 | 3/2015 | Choiniere et al. |
| 2015/0079398 | A1 | 3/2015 | Amin et al. |

OTHER PUBLICATIONS

Chaudhari et al. Crystalline Al2O3 on buffered soda-lime glass by e-beam, Matt. Lett. 136 (2014) pp. 407-410.*

Comer, J.J. et al., "Growth of Single-Crystal and Polycrystalline Thin Films of MgA12 O4 and MgFe2 O4", Nov. 1, 1965, Sperry Rand Research Center, Sudberry, MA, USA.

Lee, Kun-Yi et al., Improvement of Surface Acoustic Wave Characteristics of ZnO Film/ Interdigital Transducer/ Glass Substrate Using Alumina Film Interlayer, 2014, pp. 09PA08-1-09PA08-5, vol. 53, Japanese Journal of Applied Physics, Japan.

Huang TianMao et al., Aluminum Induced Crystallization of Strongly (111) Oriented Polycrystalline Silicon Thin Film and Nucleation Analysis, 2010, pp. 3002-3005, vol. 53, No. 11, Science China, Technological Sciences, Science China Press and Springer-Verlag Berlin, Heidelberg.

Chaudhari, P. et al. Heteroepitaxial Silicon Film Growth at 600° C. From an Al—Si Eutectic Melt, 2010, pp. 5368-5371, vol. 518, Thin Solid Films, Elsevier, USA.

Cava, S. et al., Structural Characterization of Phase Transition of Al2O3 Nanopowders Obtained by Polymeric Precursor Method, 2007, pp. 394-399, Materials Chemistry and Physics, vol. 103, Science Direct, Elsevier, USA.

Widenborg, P. et ano., Surface Morphology of Poly-Si Films Made by Aluminium-Induced Crystallisation on Glass Substrates, 2002, pp. 270-282, vol. 242, Journal of Crystal Growth, Elsevier, USA.

Wagner R.S. et ano., "Vapor-Liquid-SolidMechanism of Single Crystal Growth", Applied Physics Letters, Mar. 1, 1964, pp. 189-190, vol. 4, No. 5, AIP Publishing, U.S.

Webb W.W. et ano., "Growth and Defect Structure of Sapphire Microcrystals", Journal of Applied Physics, Dec. 1957, pp. 1449-1454, vol. 28, No. 12, AIP Publishing, U.S.

* cited by examiner

METHOD OF MAKING CERAMIC GLASS

PRIORITY AND RELATED APPLICATION

This application claims priority to U.S. Provisional Patent Application Ser. No. 61/955,543, filed Mar. 19, 2014, entitled "Method of Making Sapphire Glass," which is hereby incorporated by reference in its entirety.

FIELD OF THE INVENTION

The present invention relates to covers for displays used in devices such as smartphones, smartwatches, and computers, and to substrates used in various electronic devices such as thin-film photovoltaic modules, Light Emitting Diodes (LEDs), and Field Effect Transistors (FETs).

BACKGROUND OF THE INVENTION

Sapphire or "sapphire glass," as it is sometimes called, is a ceramic that has many industrial applications, from watch covers to envelopes for use in high temperature lamps. It is also used in military applications. Covers used in many electronic devices today, such as displays, require not only transparency but hardness for anti-scratch capability. Sapphire, one of the hardest materials, is an ideal material to meet this need. Recently, sapphire or single crystalline $Al_2O_3$ has been referred to as "sapphire glass" which is a layman's term meant to highlight the fact that crystalline $Al_2O_3$ is transparent like glass. As a transparent material with a hardness only second to diamond, it has been claimed recently as an ideal material for display covers. But sapphire glass has in fact long been used in the semiconductor industry for various applications, along with other industries such as the watch industry, for just one example. The one and only drawback of sapphire, at least as far as scratch-resistance goes, has been cost. Recently there have been attempts to reduce the price of sapphire glass for use as display covers by GTAT and Apple Inc., that disclosed methods for making inexpensive sapphire glass. Apple has disclosed additional technology for sapphire glass covers in patent applications, as have other companies, such as Corning Inc. "Sapphire glass" should therefore be considered to include polycrystalline or nanocrystalline $Al_2O_3$ (not just single crystalline) given recent patent disclosures by Apple Inc.

Industrial sapphire is created by melting aluminum oxide ($Al_2O_3$) at 2040° C. and then encouraging crystal growth with a seed and careful control of the environment. Manufacturers have developed several unique methods for growth, with varying levels of resultant quality, size, and cost. The EFG or Stephanov methods allow the directed growth of shapes like ribbon, or even tubes, however there are many limitations to what can be done. The Czochralski, HEM, or Kiropolous methods allow the highest optical quality sapphire, but the result is a rod-like "blob" of crystal called a boule, that must be entirely machined into useable shapes and sizes. Traditionally sapphire glass has been manufactured by forming boules by either the Verneuil or Czochralski processes and then slicing the sapphire from these boules. However, this method requires very high temperatures and cutting and polishing the sapphire boules requires added time and process challenges. More to the point, when making sapphire glass for devices such as smartphones, or other small devices, sapphire ingot yield rates can be as low as below 50 percent. For these and other reasons, sapphire glass as it is currently produced is expensive and not economical. Alternatively, one can make sapphire glass by sintering $Al_2O_3$ powder in order to form small grain $Al_2O_3$ material. Crystalline $Al_2O_3$ made from small grains is known to be as hard and potentially even harder than single crystal sapphire or sapphire glass. However, this sintering process must also be performed at very high temperature, greater than 1200° C., and the process is also quite involved and so far has not been a commercially viable solution to making inexpensive sapphire glass. Recently, an invention for improving sapphire glass manufacturing was disclosed by Chaudhari et al (see US 2014/0116329) and "Extremely highly textured MgO [111] crystalline films on soda-lime glass by e-beam" (Materials Letters 121 (2014) 47-49). These disclosures fail, however, to provide a method for making an enhanced quality ceramic (e.g. sapphire) layer on the crystalline MgO substrate.

Thus, a new method is disclosed here that will not only provide sapphire glass that is cost effective, simple and can take place at low temperatures (ideally 600 C or below), and also provide small grains for added hard, scratch-free, material, but can provide an enhanced, high quality ceramic layer such as sapphire In accordance with one aspect of the present invention, the foregoing and other objects can be achieved by using the common electron beam (e-beam) evaporation process known in the trade, and depositing Magnesium Oxide (MgO) on a soda-lime glass substrate.

In accordance with another aspect of the present invention the foregoing and other objects can be achieved by using e-beam evaporating Al in an $O_2$ atmosphere to get a crystalline film on the MgO layer previously deposited. Specifically, this is done by evaporating Al and then adding $O_2$ so that Al reacts with $O_2$ on the surface of the MgO to form crystalline oxide.

In accordance with another aspect of the present invention the foregoing and other objects can be achieved by keeping Al on the MgO surface so it can spread on the surface to form a desired crystalline phase.

BRIEF SUMMARY OF THE INVENTION

Ceramic glass, such as sapphire glass, is produced using e-beam to deposit Magnesium Oxide on a soda-lime glass substrate, followed by evaporation of Al in an $O_2$ atmosphere to get a crystalline film on the previously deposited MgO layer.

DETAILED DESCRIPTION OF THE INVENTION

Figure 1:
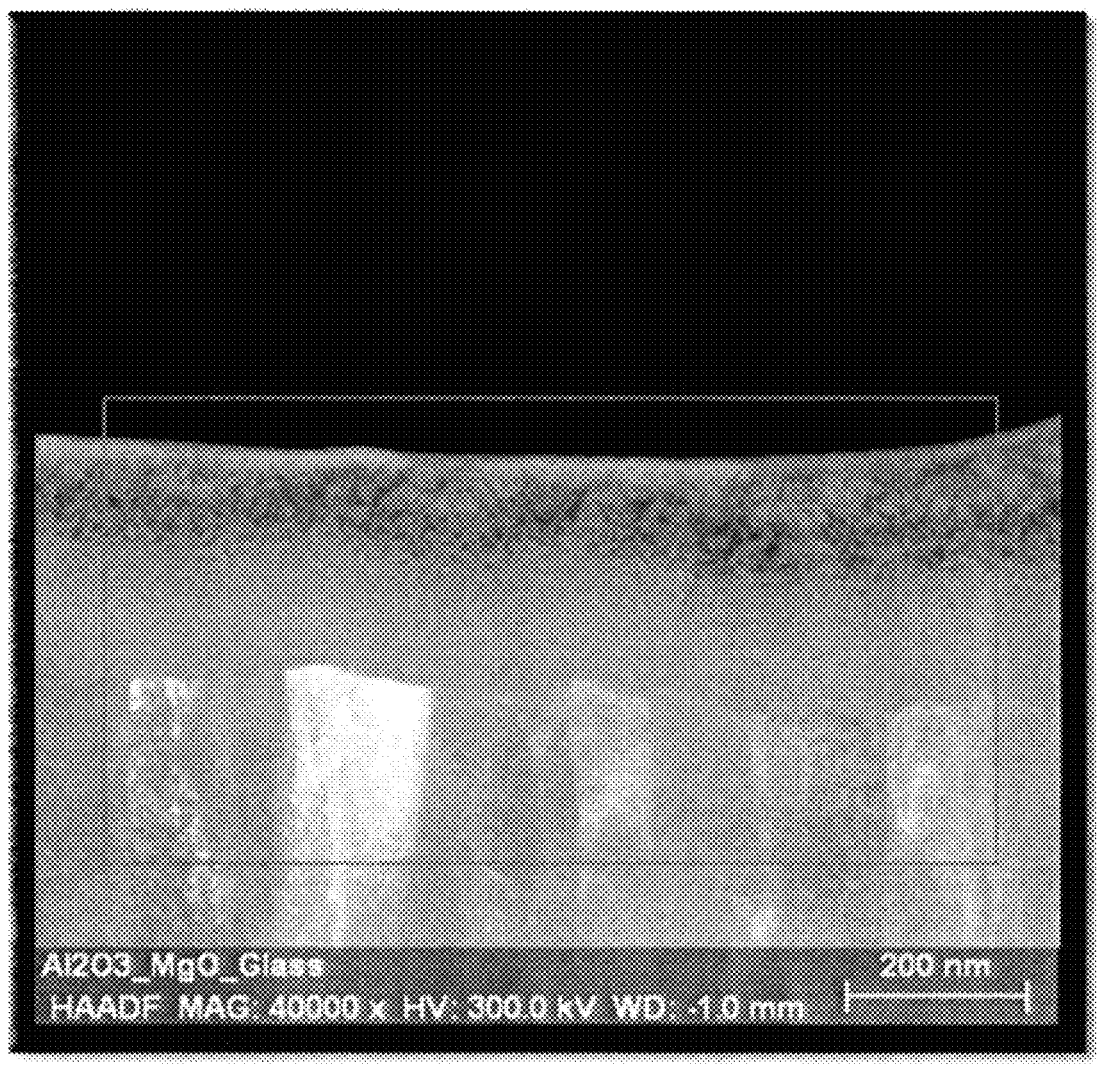
FIG. 1 shows TEM cross section of Al2O3 on highly textured MgO [111] layer. The MgO layer is on soda-lime glass, which cannot be seen here. Additionally, the Al2O3 film here is entirely amorphous (and therefore not the aim of the disclosed invention but demonstrates a step in that direction).

Transparent ceramics have many useful applications and consist of a number of materials. Sapphire ($Al_2O_3$), Spinel ($MgAl_2O_4$), AlON (Aluminium oxynitride spinel ($Al_{23}O_{27}N_5$)), and $ZrO_2$ are some of the most common and there are others. Today transparent ceramics are commonly made transparent by sintering. Here a novel method for making transparent ceramics from these materials is presented which replaces sintering with a process that has many advantages such as lower temperature, high texture, less material, simpler deposition, and potential for scalability.

In one embodiment of the invention, a thin layer of metal is deposited on a crystalline Magnesium Oxide (MgO) coated glass substrate followed by the introduction of oxygen ($O_2$). For example, in one embodiment, Al (aluminum) is deposited as a thin layer on the crystalline coated glass substrate followed by the introduction of $O_2$. The crystalline MgO coated substrate can be fabricated using the process disclosed by A. Chaudhari et al in "Extremely highly textured MgO[111] crystalline films on soda-lime glass by e-beam" and in US patent application 2014/0245947 by Vispute and Seiser. Alternatively, the crystalline MgO can be deposited by any of the other techniques known in the art, such as Inclined Substrate Deposition (ISD) or Ion Beam Assisted Deposition (IBAD).

It should be noted that having two layers of material, for example $Al_2O_3$ and MgO, that are different, may have beneficial qualities. For example, the $Al_2O_3$ may be less likely to crack since the underlying layer is a different material and perhaps has a different orientation. This "weaving" effect may serve to strengthen the final cover material or film and have other beneficial effects.

The Al is deposited on the MgO/glass substrate at 550° C. and when $O_2$ is introduced a crystalline $Al_2O_3$ is formed. The Al is deposited 1 nm at a time, combined with $O_2$. If a thicker Al film were deposited, for example 500 nm, combined with $O_2$, then an $Al_2O_3$ film would form on the Al and it would be impossible to grow the crystalline $Al_2O_3$. The number of 1 nm Al with $O_2$ layers can vary according to the desired outcome. For example, a thicker layer may give better hardness value (Hv) as measured by Vickers or Knoop. On the other hand, a thinner layer may provide better transparency or real in-line transmission. Although small grains are preferable for increased hardness, according to the Hall-Petch relationship, it may be desirable in certain instances to increase the grain size. For example, larger grains are beneficial when depositing semiconductor thin-films such as silicon for solar cells, or GaN for LEDs. In this case, annealing the substrate after deposition of the $Al_2O_3$ layer may increase crystallinity and grain size.

It is known that $Al_2O_3$ has different phases, such as gamma and alpha. Moreover, it is known that each phase has certain attributes that can be desirable depending on the need. There are advantages and disadvantages to using alpha and gamma phases. In this invention, two different phases of $Al_2O_3$ are disclosed, alpha and gamma. For applications such as cover glass, hardness (Hv) is crucial for anti-scratch capability. In such applications, the sapphire (crystalline $Al_2O_3$ layer) may have a crystal structure that is gamma, since gamma phase $Al_2O_3$ is cubic. Moreover, another benefit of the cubic, gamma phase is that the non-cubic, alpha phase of $Al_2O_3$ has birefringence which reduces transparency. As it so happens, since the $Al_2O_3$ layer is deposited below 700° C. it is likely that the $Al_2O_3$ is cubic, because the phase of the $Al_2O_3$ is most likely gamma. With regard to alpha phase $Al_2O_3$, it is known that birefringence along the optic of c-axis of the alpha $Al_2O_3$ is eliminated. For alpha $Al_2O_3$ the c-axis is [006]. Finally anisotropic single crystal materials exhibit some properties such as thermal expansion and hardness which vary significantly by orientation. For example, sapphire with crystal orientation perpendicular to the c-axis is harder than orientation parallel to the c-axis. And c-axis sapphire is harder than other axes in $Al_2O_3$, such as r, n, or a.

Thus in one embodiment there is deposition of a gamma phase of $Al_2O_3$ and in another embodiment an alpha phase of $Al_2O_3$, and both embodiments are deposited heteroepitaxially on a crystalline MgO buffer layer on soda-lime glass. Each phase of $Al_2O_3$ is deposited separately, and can be chosen depending on the desired outcome.

Upon completion of the deposition process, polishing may or may not be required depending on the use. If the sapphire glass is going to be used for display covers, for example, it is unlikely that it needs polishing which would be an additional cost-savings advantage over current sapphire manufacturing techniques. If the sapphire glass is going to be used as a substrate for additional device fabrication on which layers will deposited, then some polishing may be beneficial. If the sapphire glass is, for example, polycrystalline then crystallographic orientations being exposed on the surface potentially make a polishing operation difficult to achieve a quality surface as the different crystal planes of sapphire polish at different rates. If the sapphire glass is highly textured, and the crystal orientations have more or less the same planes, then polishing may be easier. In this case more time and money would be saved.

Finally, highly textured ceramic layers as discussed here, can serve as substrates on which to deposit highly textured heteroepitaxial semiconductor films such as silicon which due to the aligned grains can have advantageous light trapping and reflection control helpful in the case of solar cell devices (see Campbell et al, "Light trapping and reflection control in solar cells using tilted crystallographic surface textures," 1993). The textured ceramics discussed here may have the same or similar light trapping and reflection properties.

EXAMPLE 1

E-beam evaporation technique was used for the growth of sapphire glass. The evaporator consists of a stainless steel high vacuum chamber capable of reaching 10E-7 Torr with the help of a cryopump. Initial rough vacuum up to 10-3 Torr was achieved with a mechanical dry pump. Prior to vacuuming the chamber, batches of initial glass substrates were loaded on a substrate heater that is capable of controlling temperature of the substrates while growing the MgO buffer layer and sapphire layer in reactive deposition mode. A typical buffer layer of MgO was grown from stoichiometric MgO source material. The presence of background pressure of $O_2$ (~10E-4 Torr using $O_2$ flow need valve)) helps high quality stoichiometric MgO depositions. Substrate temperature was controlled from 300 C to 650 C temperature range to control the preferred orientation of the MgO films. Required growth temperature was set using a substrate heater with a typical ramp rate ranging from 15 C/min to 45 C/min. At this stage the system is ready for deposition of the first layer that is MgO. E-beam parameters such as high voltage and emission current were set so that the appropriate evaporation rate of MgO can be achieved. The high voltage (HV approximately 8 KV) for electron beam was setup through potentiometer of the ebeam evaporator system. A good range for setting the bias for Telemark sources is between 17 to 20 A. The electron beam sweep pattern settings can also be judged and finalized without affecting the material. The ebeam system also has joystick that can directly control the e-beam output position, allowing the precondition of the material manually. Once high voltage and emission current is set with desirable evaporation rate of MgO, deposition was conducted for 1 to 2 hrs depending upon the film thickness requirement. Studies show varied film thickness of MgO films from a few microns to 6 microns is possible. After MgO deposition, a high purity aluminum (99.999) source was switched for deposition. Initially, the Al source was heated by ebeam to melt the source and the ebeam was adjusted for evaporation of aluminum. Partial pressure was adjusted from 10-4 Torr to 10-6 Torr in order to control reaction of the Al with $O_2$ on the substrate. Note that the arrival rate of $O_2$ is adjusted in a way that Al surface mobility can be as high as possible to allow surface migration and then reaction with oxygen so that crystalline properties, grain size, surface smoothness, optical transparency, and interface reaction can be controlled. Thus optimization of aluminum oxide ($Al_2O_3$) growth includes arrival rates of oxygen background reactive gas atoms and ebeam evaporated aluminum in such a way that aluminum has optimum surface migration for crystallinity and grain size control and reaction with oxygen to form crystalline sapphire ($Al_2O_3$) or sapphire glass.

Figure 2:
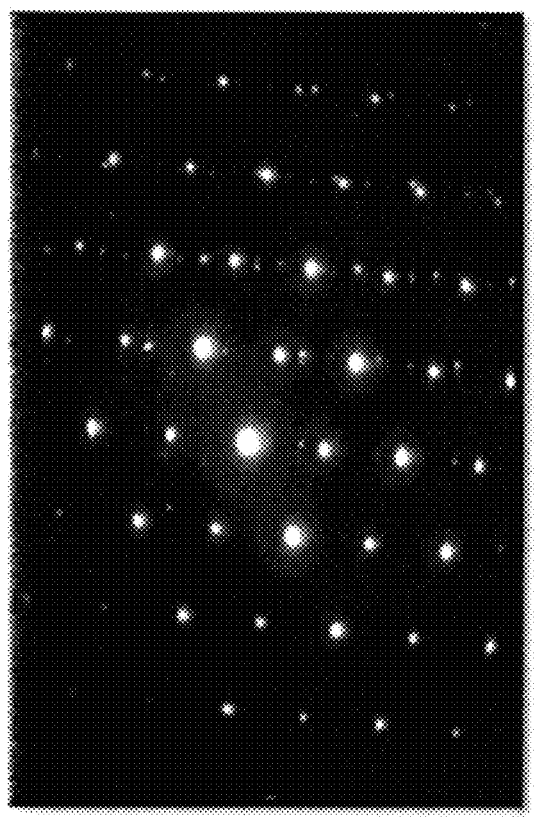
FIG. 2 is TEM diffraction pattern of highly textured MgO [111] film on soda-lime glass showing highly aligned, and textured, MgO.

FIG. 1 shows TEM cross section of $Al_2O_3$ on highly textured MgO [111] layer. The MgO layer is on soda-lime glass, which cannot be seen here. Additionally, the $Al_2O_3$ film here is entirely amorphous (and therefore not the result of the inventive process, but is a step toward proof in conception). FIG. 2 shows TEM diffraction pattern of highly textured MgO [111] film on soda-lime glass showing highly aligned, and textured, MgO.

EXAMPLE 2

The same process as in example 1 can be used to grow Zirconium Oxide (ZrO2).

E-beam evaporation technique is used for the growth of zirconium glass. The evaporator consists of a stainless steel high vacuum chamber capable of reaching 10E-7 Torr with the help of a cryopump. Initial rough vacuum up to 10-3 Torr is achieved with a mechanical dry pump. Prior to vacuuming the chamber, batches of initial glass substrates are loaded on a substrate heater that is capable of controlling temperature of the substrates while growing the MgO buffer layer and sapphire layer in reactive deposition mode. A typical buffer layer of MgO was grown from stoichiometric MgO source material. The presence of background pressure of $O_2$ (~10E-4 Torr using $O_2$ flow need valve)) helps high quality stoichiometric MgO depositions. Substrate temperature was controlled from 300 C to 650 C temperature range to control the preferred orientation of the MgO films. Required growth temperature is set using a substrate heater with a typical ramp rate ranging from 15 C/min to 45 C/min. At this state the system is ready for deposition of the first layer that is MgO. E-beam parameters such as high voltage and emission current are set so that the appropriate evaporation rate of MgO can be achieved. The high voltage (HV approximately 8 KV) for electron beam is setup through potentiometer of the ebeam evaporator system. A range for setting the bias for Telemark sources may be between 17 to 20 A. The electron beam sweep pattern settings can also be judged and finalized without affecting the material. The ebeam system also has a joystick that can directly control the e-beam output position, allowing the precondition of the material manually. Once high voltage and emission current is set with desirable evaporation rate of MgO, deposition is conducted for 1 to 2 hrs depending upon the film thickness requirement. Studies show varied film thickness of MgO films from a few microns to 6 microns is possible. After MgO deposition, high purity zirconium (99.999) source is switched for deposition. Initially, the Zr source was heated by ebeam to melt the source and the ebeam is adjusted for evaporation of zirconium. Partial pressure was adjusted from 10-4 Torr to 10-6 Torr in order to control reaction of the Zr with $O_2$ on the substrate. Note that the arrival rate of $O_2$ is adjusted in a way that Zr surface mobility can be as high as possible to allow surface migration and then reaction with oxygen so that crystalline properties, grain size, surface smoothness, optical transparency, and interface reaction can be controlled. Thus optimization of zirconium oxide (Zr $O_2$) growth includes arrival rates of oxygen background reactive gas atoms and ebeam evaporated aluminum in such a way that Zr has optimum surface migration for crystallinity and grain size control and reaction with oxygen to form crystalline zirconium (Zr $O_2$).

EXAMPLE 3

The same process as in example 1 can be used to grow silicon oxide (Si $O_2$).

E-beam evaporation technique was used for the growth of silicon oxide ceramic. The evaporator consists of a stainless steel high vacuum chamber capable of reaching 10E-7 Torr with the help of a cryopump. Initial rough vacuum up to 10-3 Torr is achieved with a mechanical dry pump. Prior to vacuuming the chamber, batches of initial glass substrates are loaded on a substrate heater that is capable of controlling temperature of the substrates while growing the MgO buffer layer and sapphire layer in reactive deposition mode. A typical buffer layer of MgO is grown from stoichiometric MgO source material. The presence of background pressure of $O_2$ (~10E-4 Torr using $O_2$ flow need valve)) helps high quality stoichiometric MgO depositions. Substrate temperature is controlled from 300 C to 650 C temperature range to control the preferred orientation of the MgO films. Required growth temperature was set using a substrate heater with a typical ramp rate ranging from 15 C/min to 45 C/min. At this state the system is ready for deposition of the first layer that is MgO. E-beam parameters such as high voltage and emission current are set so that the appropriate evaporation rate of MgO can be achieved. The high voltage (HV approximately 8 KV) for electron beam is setup through potentiometer of the ebeam evaporator system. A good range for setting the bias for Telemark sources is between 17 to 20 A. The electron beam sweep pattern settings can also be judged and finalized without affecting the material. The ebeam system also has joystick that can directly control the e-beam output position, allowing the precondition of the material manually. Once high voltage and emission current is set with desirable evaporation rate of MgO, deposition was conducted for 1 to 2 hrs depending upon the film thickness requirement. Studies show varied film thickness of MgO films from a few microns to 6 microns is possible. After MgO deposition, high purity Si (99.999) source was switched for deposition. Initially, the Si source was heated by ebeam to melt the source and the ebeam is adjusted for evaporation of Si. Partial pressure was adjusted from 10-4 Torr to 10-6 Torr in order to control reaction of the Si with $O_2$ on the substrate. Note that the arrival rate of $O_2$ is adjusted in a way that Si surface mobility can be as high as possible to allow surface migration and then reaction with oxygen so that crystalline properties, grain size, surface smoothness, optical transparency, and interface reaction can be controlled. Thus optimization of Si oxide ($SiO_2$) growth includes arrival rates of oxygen background reactive gas atoms and ebeam evaporated silicon in such a way that silicon has optimum surface migration for crystallinity and grain size control and reaction with oxygen to form crystalline silicon oxide ($SiO_2$).

EXAMPLE 4

The same process as in example 1 can be used to grow a nitride, such as titanium nitride (TiN) ceramic.

E-beam evaporation technique is used for the growth of TiN. The evaporator consists of a stainless steel high vacuum chamber capable of reaching 10E-7 Torr with the help of a cryopump. Initial rough vacuum up to 10-3 Torr is achieved with a mechanical dry pump. Prior to vacuuming the chamber, batches of initial glass substrates are loaded on a substrate heater that is capable of controlling temperature of the substrates while growing the MgO buffer layer and sapphire layer in reactive deposition mode. A typical buffer layer of MgO is grown from stoichiometric MgO source material. The presence of background pressure of $O_2$ (~10E-4 Torr using $O_2$ flow need valve)) helps high quality stoichiometric MgO depositions. Substrate temperature is controlled from 300 C to 650 C temperature range to control the preferred orientation of the MgO films. Required growth temperature is set using a substrate heater with a typical ramp rate ranging from 15 C/min to 45 C/min. At this state the system is ready for deposition of the first layer that is MgO. E-beam parameters such as high voltage and emission current are set so that the appropriate evaporation rate of MgO can be achieved. The high voltage (HV approximately 8 KV) for electron beam was setup through potentiometer of the ebeam evaporator system. A good range for setting the bias for Telemark sources is between 17 to 20 A. The electron beam sweep pattern settings can also be judged and finalized without affecting the material. The ebeam system also has joystick that can directly control the e-beam output position, allowing the precondition of the material manually. Once high voltage and emission current is set with desirable evaporation rate of MgO, deposition is conducted for 1 to 2 hrs depending upon the film thickness requirement. Studies show varied film thickness of MgO films from a few microns to 6 microns is possible. After MgO deposition, high purity titanium (99.999) source is switched for deposition. Initially, the Ti source is heated by ebeam to melt the source and the ebeam is adjusted for evaporation of titanium. Partial pressure is adjusted from 10-4 Torr to 10-6 Torr in order to control reaction of the Ti with $O_2$ on the substrate. Note that the arrival rate of $O_2$ is adjusted in a way that Ti surface mobility can be as high as possible to allow surface migration and then reaction with oxygen so that crystalline properties, grain size, surface smoothness, optical transparency, and interface reaction can be controlled. Thus optimization of Ti nitride (TiN) growth includes arrival rates of oxygen background reactive gas atoms and ebeam evaporated Ti in such a way that Ti has optimum surface migration for crystallinity and grain size control and reaction with oxygen to form crystalline titanium nitride (TiN).

In the preceding samples further annealing, for example for 1 or 2 hours, with Ar, or $O_2$, may be desirable.

Finally, when designing glass for cover purposes, reflectivity is an issue that needs to be addressed. The greater the reflectivity the lower the transmission. Therefore, it can be advantageous to add an anti-reflection coating to the $Al_2O_3$, or ceramic, layer.

While the present invention has been described in conjunction with specific embodiments, those of normal skill in the art will appreciate the modifications and variations can be made without departing from the scope and the spirit of the present invention. Such modifications and variations are envisioned to be within the scope of the appended claims.

The invention claimed is:

1. A method of making ceramic glass comprising steps of:
   depositing crystalline MgO on a glass substrate at a temperature below the softening point of the glass;
   depositing a metal thin-film on said MgO on glass in one nanometer layers, one layer at a time, at a temperature below the softening point of glass; and
   depositing $O_2$ onto the metal thin film after each one nanometer layer of the metal film is deposited, while keeping the glass substrate heated, wherein the number of one nanometer layers each followed by $O_2$ deposition, varies based on the desired thickness.

2. The method of claim 1, wherein the metal thin film is evaporated in an atmosphere of $O_2$ such that the metal reacts with $O_2$ on the surface of the MgO to form an oxide.

3. The method of claim 1, wherein the metal on the MgO surface spreads to form a desired crystalline phase.

4. The method of claim 1, wherein the metal comprises one or more of Zr, Ti, Ga, Y, Hf, Ta, In, Si, and Sn.

5. The method of claim 2, wherein the metal reacts with a N on the surface of the MgO to form a nitride.

6. The method of claim 5, wherein the nitride is aluminium oxynitride spinel ($Al_{23}O_{27}N_5$).

7. The method of claim 1, wherein the crystalline MgO is [111] oriented.

8. The method of claim 1, wherein the glass is soda-lime.

9. The method of claim 1, wherein the metal comprises one or more of Al, Mg, and Zr.

10. The method of claim 1, wherein the ceramic glass comprises at least one of: sapphire ($Al_2O_3$), spinel ($MgAl_2O_4$), AlON ((Aluminium oxynitride spinel ($Al_{23}O_{27}N_5$)), or Zirconia ($ZrO_2$).

11. A method of making ceramic glass comprising the steps of:
   depositing MgO on soda-lime glass at a temperature between 300 C and 600 C using an electron beam;
   depositing Al on said MgO on said soda-lime glass in one nanometer layers, one layer at a time, at a temperature between 300 C and 600 C using said electron beam;
   depositing $O_2$ onto the Al after each one nanometer layer of the Al film is deposited, evaporating said Al in an atmosphere of $O_2$ such that said Al reacts with said $O_2$ on a surface of the MgO to form an oxide film, wherein said Al reacts with said $O_2$ thereby spreading on the MgO surface to form a crystalline phase of $Al_2O_3$, and repeating the one nanometer Al depositions, each followed by the $O_2$ depositions, until a desired thickness is reached.

12. The method of claim 11, wherein the oxide film is highly textured.

13. The method of claim 11, wherein the oxide film is polycrystalline.

14. The method of claim 11, wherein the oxide film is single crystalline.

15. The method of claim 11, wherein the MgO film is [111] oriented.

16. The method of claim 11, wherein the $Al_2O_3$ film is [006] oriented.

17. The method of claim 11, wherein the grain size of the oxide film is less than 1 micron.

18. The method of claim 11, wherein the grain size of the oxide film is greater than 1 micron.

19. The method of claim 11, wherein the soda-lime glass is an envelope.

20. The method of claim 1, wherein the metal thin-film is composed of a compound.

21. The method of claim 1, which uses the Hall-Petch effect to increase hardness.

22. The method of claim 11, which uses the Hall-Petch effect to increase hardness.

* * * * *